United States Patent [19]
Johnson et al.

[11] Patent Number: 5,914,857
[45] Date of Patent: Jun. 22, 1999

[54] AIR FLOW DEVICES FOR ELECTRONIC BOARDS

[75] Inventors: Eric A. Johnson, Greene; Sanjeev B. Sathe, Johnson City, both of N.Y.

[73] Assignee: International Business Machines Corporation, Armonk, N.Y.

[21] Appl. No.: 09/050,844

[22] Filed: Mar. 30, 1998

[51] Int. Cl.$^6$ ........................................... H05K 7/20
[52] U.S. Cl. ........................... 361/690; 361/704; 361/719;
165/80.3; 257/713; 257/721
[58] Field of Search ...................... 361/688, 689,
361/690, 695, 699, 704, 707, 709, 718,
719, 717; 257/706, 707, 717, 713, 719,
722; 174/15.1, 16.1, 16.3; 165/80.2, 80.3,
80.4, 104.33, 185

[56] References Cited

U.S. PATENT DOCUMENTS

| 3,730,264 | 5/1973 | Krylow et al. ........................ 165/128 |
| 3,956,673 | 5/1976 | Seid ........................................ 361/690 |
| 4,765,397 | 8/1988 | Chrysler et al. ...................... 165/80.3 |
| 5,077,601 | 12/1991 | Hatada et al. . | |
| 5,150,278 | 9/1992 | Lynes et al. ......................... 361/690 |
| 5,304,845 | 4/1994 | Lindquist et al. . | |
| 5,461,201 | 10/1995 | Schonberger et al. . | |
| 5,513,071 | 4/1996 | La Violette et al. . | |
| 5,563,768 | 10/1996 | Perdue . | |
| 5,734,552 | 3/1998 | Krein ..................................... 361/695 |

OTHER PUBLICATIONS

Research Disclosure of Jul. 1988, No. 29104, Kenneth Mason Publications Ltd., England.

Primary Examiner—Leo P. Picard
Assistant Examiner—Boris L. Chervinsky
Attorney, Agent, or Firm—Salzman & Levy

[57] ABSTRACT

A cooling system for electronic boards and cards is described. The cooling system is designed to provide streamlined air flow about heated components disposed upon the boards. The cooling system comprises at least one deflector that utilizes naturally occurring convection within the housing to cool heated components disposed on the board. A lifter portion of each deflector causes pre-heated air from upstream components to rise above downstream components. A collector portion allows cool air to be drawn in and over these downstream components, thus keeping them cool by minimizing or eliminating the impingement of the pre-heated air. A plurality of deflectors arranged in a predetermined pattern can also be utilized.

3 Claims, 3 Drawing Sheets

Top View

End View

View A-A

Side View

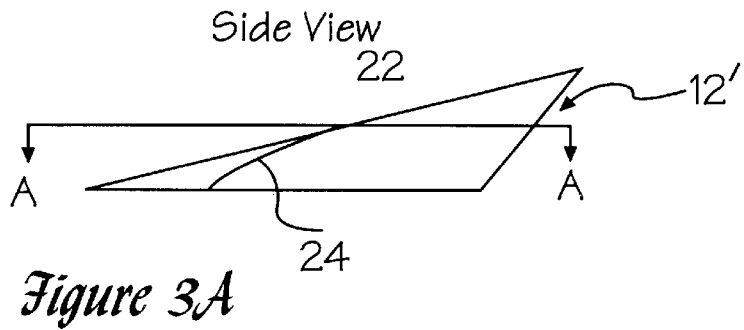
*Figure 3A*
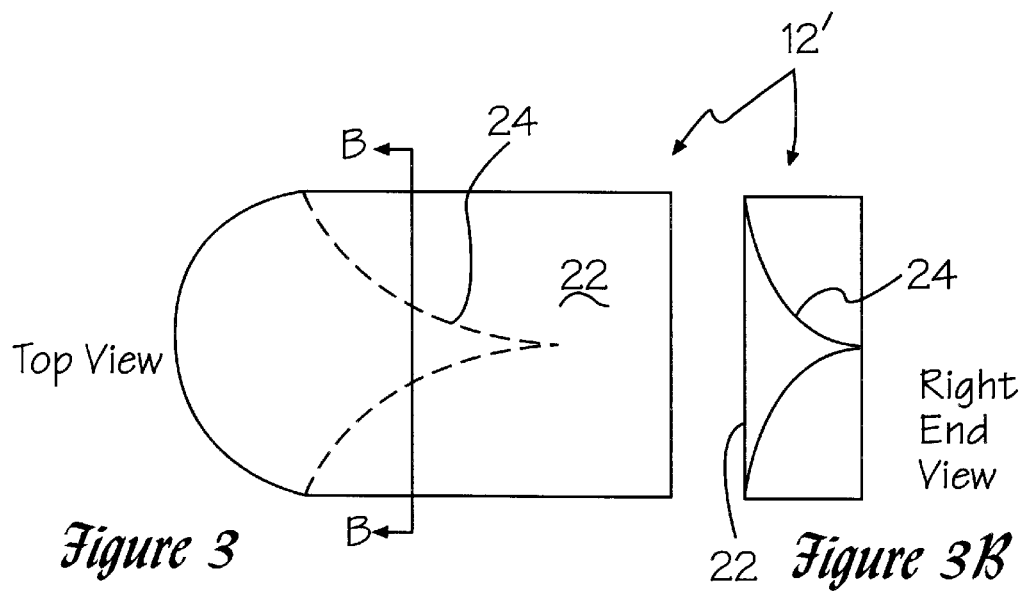
*Figure 3*
*Figure 3B*
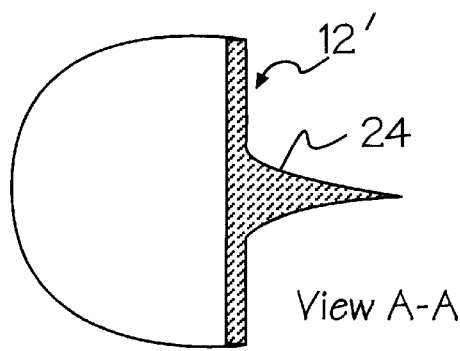
*Figure 3C*
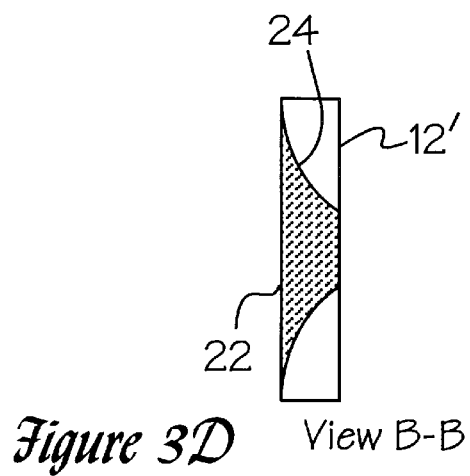
*Figure 3D*

AIR FLOW DEVICES FOR ELECTRONIC BOARDS

FIELD OF THE INVENTION

The present invention relates to air flow devices for electronic and computer boards and, more particularly to deflectors that are anchored to the electronic boards and electronic cards to provide natural convectional air flow about heated board components in order to cool them.

1. Background of the Invention

Electronic board and card failures may be due, in large measure, to overheating of critical components. Fans are typically used to create a forced air flow over the board components in order to draw or remove heat from them. There are always components, however, situated in recessed areas. These components are inaccessible to the circulating air, resulting in overheating and premature failure. There are also cases where, due to cost or noise constraints, forced air is not provided.

This invention makes use of natural air currents within the casings of the computers to resolve the overheating problem. Heat dissipated from various cards and components disposed upon a board results in natural convection within the casing. Cooler air flows into the spaces vacated by the rising warm air currents, thus providing needed circulation therein. However, unless properly directed, these air currents do not have a substantial effect in relieving the overheating of any of the poorly situated components, particularly those that lie in air-streams that have been pre-heated by other components.

The present invention includes at least one and preferably several stationary deflectors for mounting upon the electronic boards or cards to channel the heated air. The deflectors establish a directed convection about specific components. In addition, the stationary deflectors of the current invention can be integrally formed about low heat components, such as capacitors. This integration conserves board space and ensures high component density for the board or card.

Another advantage of the inventive deflectors is their low relative cost. This invention uses low cost, molded plastics to fabricate the various deflector shapes.

The deflectors of this invention provide a three-dimensional air flow. They lift pre-heated air over downstream components and, simultaneously therewith, the deflectors also provide side channels that allow cooler air to flow directly over these downstream components, thus keeping them cool.

2. Discussion of Related Art

It is known in the art to provide deflectors to deflect heat, as shown in the Research Disclosure of July 1988, No. 29104, Kenneth Mason Publications Ltd., England. The subject deflectors comprise flat metal clips that snap into place without any tooling. However, these deflectors do little to channel the air flow about the components.

In U.S. Pat. No. 5,563,760, issued to Perdue on Oct. 8, 1996, entitled "HEAT SOURCE COOLING APPARATUS AND METHOD UTILIZING MECHANISM FOR DIVIDING A FLOW OF COOLING FLUID", a series of cooling fins is illustrated. The fins form a plurality of side-by-side channels that directs cooling air toward and away from heat-producing diodes. Primary baffles redirect flow through the channels.

In U.S. Pat. No. 5,513,071, issued on Apr. 30, 1996, to La Violette et al, entitled "ELECTRONICS HOUSING WITH IMPROVED HEAT REJECTIONS", a rack of electronic equipment is convection cooled. A plurality of fins directs air over heat-producing diodes. A heat sink conducts heat away from a hotter casing section.

In U.S. Pat. No. 5,461,201, issued to Schonberger et al, on Oct. 24, 1995, entitled "INSULATING PART WITH INTEGRAL COOLING ELEMENT", an electronic device containing an insulator with a heat sink, is illustrated. The insulator is fabricated from a molded plastic.

In U.S. Pat. No. 5,304,845, issued to Lindquist et al, on Apr. 19, 1994, entitled "APPARATUS FOR AN AIR IMPINGEMENT HEAT SINK USING SECONDARY FLOW GENERATORS", an apparatus is disclosed that augments the heat sink in the removal of heat. The apparatus comprises a plurality of ribs that causes secondary flow in the cooling fluid. The ribs create vortices that displace hotter, slower moving fluids.

In U.S. Pat. No. 5,077,601, issued to Hatada et al, on Dec. 31, 1991, entitled "COOLING SYSTEM FOR COOLING AN ELECTRONIC DEVICE AND HEAT RADIATION FIN FOR USE IN THE COOLING SYSTEM", a cooling system with a plurality of constricted flow passages, is illustrated. Air flow is forced through the constricted passages to a main and auxiliary passage that directs the cooling air to heated components.

SUMMARY OF THE INVENTION

In accordance with the present invention, there is provided a cooling system for electronic boards and cards. The cooling system comprises at least one deflector that utilizes naturally occurring convection within the housing in order to cool heated components disposed on the board. The deflector is made of inexpensive molded plastic, and is usually attached to the card or board by epoxy or mechanical fasteners. The deflector can be attached about non-heating components, such as capacitors. The deflector shape is streamlined to maintain a low pressure drop or flow impedance. The deflector includes a collector portion and a lifter portion. The lifter portion receives the pre-heated air from upstream components and induces the heated air to rise above the level of downstream components. This reduces the possibility of the downstream components overheating, by reason that they are no longer in the stream of the heated air. The collector portion of the deflector is wider than the components in order to provide proper air flow conditions. The collector portion ensures that the downstream part of the board or card is cooled by the fresh, cooler air from the side flow.

It is an object of this invention to provide an improved air flow system for electronic boards and cards.

It is another object of the invention to provide an air flow system for electronic boards and cards comprising a series of deflectors that cool heated components by natural convective forces within the electronic housing.

It is a further object of the invention to provide air flow about the components of an electronic board or card, so that pre-heated air is lifted away from downstream components, while cooling air is collected along the sides thereof beyond the stream of pre-heated air.

BRIEF DESCRIPTION OF THE DRAWINGS

A complete understanding of the present invention may be obtained by reference to the accompanying drawings, when considered in conjunction with the subsequent detailed description, in which:

FIG. 1a illustrates a side view of the portion of the cooling system shown in FIG. 1;

FIG. 2 shows a first embodiment top view of one of the deflectors depicted in FIGS. 1 and 1a;

FIG. 3 illustrates a top view of a second embodiment of the deflectors shown in the cooling system of FIGS. 1 and 1a;

FIG. 3a shows a side view of the deflector illustrated in FIG. 3;

FIG. 3b depicts a right end view of the deflector shown in FIG. 3;

FIG. 3c illustrates a sectional view of the deflector taken along lines A—A of FIG. 3a; and FIG. 3d shows a sectional view of the deflector illustrated in FIG. 3 taken along lines B—B.

For purposes of clarity and brevity, like elements and components will bear the same numbering and designation throughout the figures.

DESCRIPTION OF THE PREFERRED EMBODIMENT

Generally speaking, the invention features a cooling system for electronic boards and cards. The cooling system comprises one or more deflectors that utilize naturally occurring convection within the housing to cool heated components disposed on the board. These deflectors prevent pre-heated air from flowing over, or impinging upon, downstream devices.

Figure 1:
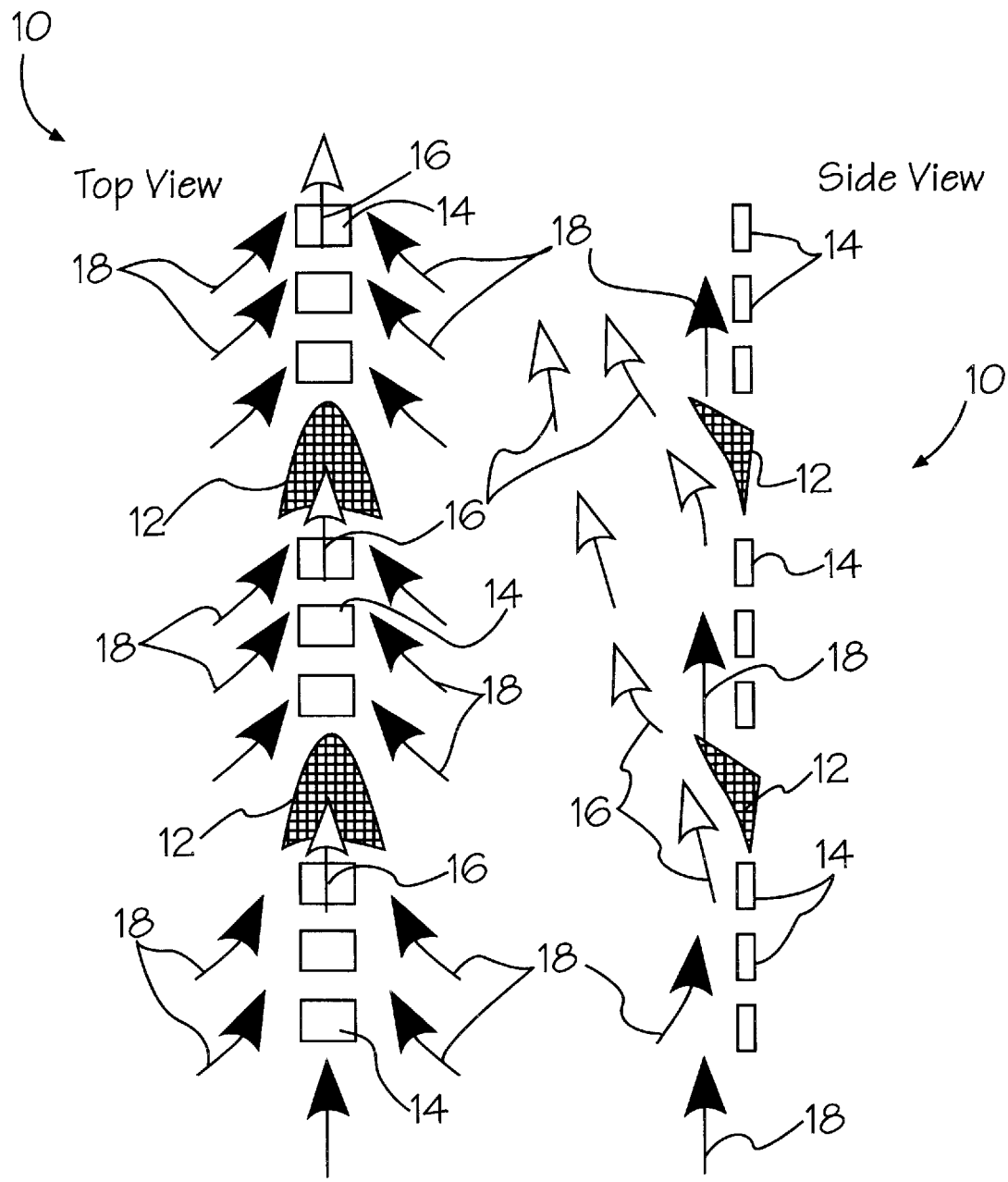
FIG. 1 depicts a top view of a typical portion of the cooling system for electronic boards and cards in accordance with this invention.
Figure 2:
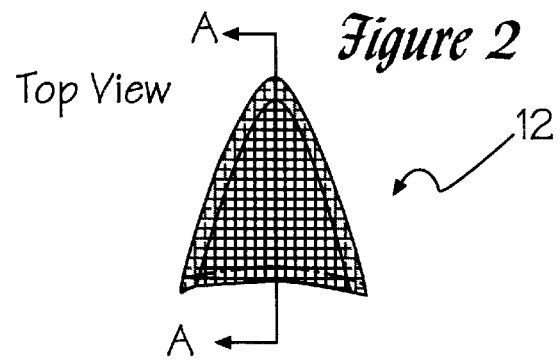
Figure 2A:
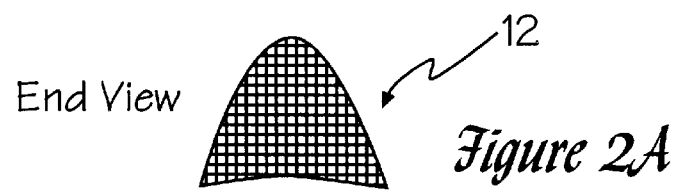
FIG. 2a illustrates an end view of the deflector depicted in FIG. 2.
Figure 2B:
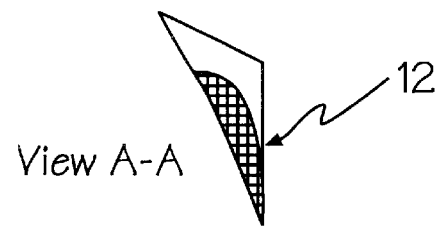
FIG. 2b shows a sectional view of the deflector depicted in FIG. 2, taken along lines A—A.
Figure 2C:
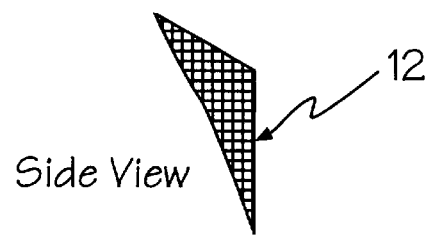
FIG. 2c depicts a side view of the deflector shown in FIG. 2.

Now referring to FIGS. 1 and 1a, a portion 10 of the cooling system of this invention is shown. The portion 10 comprises only two typical deflectors 12, for purposes of brevity, disposed about a plurality of components or modules 14, all attached to an electronic board or card (not shown). Natural convection currents passing about the components 14 are represented by light (outline) and dark (solid) arrows 16 and 18, respectively. The light arrows 16 depict the heated air being lifted over the components 14, while the dark arrows 18 illustrate the flow of cool air drawn from the sides and flowing above and around the components 14.

The plurality of deflectors 12 utilizes naturally occurring convection within the housing to cool the heated components 14 disposed on the board. The deflectors 12 are made of inexpensive molded plastic, and are usually attached to the card or board by epoxy or mechanical fasteners.

Referring to FIGS. 2 and 2a through 2c, several views are shown of a first embodiment of the deflectors 12 illustrated in FIGS. 1 and 1a. The deflector 12 is generally shaped like an irregular tetrahedron. Air flowing over the top of the deflector 12 tends to be lifted over the downstream components 14, shown in FIGS. 1 and 1a. Air flowing along the sides of the deflector 12 passes about the sides of the components 14 and directly over the planar top surface of these components. As can be seen from FIGS. 1 and 1a, the width of deflector 12 is greater than the width of the components 14. The deflector 12 is wider than the components 14 in order to provide proper air flow conditions about the components.

Referring to FIGS. 3 and 3a through 3d, there is shown a second embodiment of the deflector 12 of the cooling system 10 of this invention. The second embodiment is depicted by the deflector 12'. The top surface 22 of deflector 12' comprises a lifter portion for directing air upwardly (arrows 16 of FIGS. 1 and 1a) over the downstream components 14 on the electronic board. The lower portion of the deflector 12' comprises a collector portion 24, that is shaped like a keel of a ship. The collector 24 collects cool air that displaces the rising heated air, and directs its flow along the sides of, and over the top of, the components 14, as shown by dark arrows 18 in FIGS. 1 and 1a.

The deflector 12' reduces the possibility of the downstream components 14 overheating, since they are no longer impinged upon by heated air of the upstream components 14. The deflector 12' is streamlined to maintain a low flow impedance. The collector portion 24 of the deflector 12', like its first embodiment 12, is wider than components 14 in order to provide proper air flow conditions, drawing cooling air flow in from the sides of the components. The collector portion 24 ensures that the flow resistance is minimized so that the downstream part of the board or card is cooled by the fresh, cooler air from the side flow.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A cooling system for an electronic board or card, comprising at least one deflector for use with an electronic board or card comprising a number of electronic components, said deflector having a substantially tetrahedral shape which utilizes naturally occurring convection within a housing containing said electronic board or card, in order to cool said electronic components of said electronic board or card, said deflector having a top portion defining an air lifter and side portions defining air collectors, said top portion having an air flow surface for receiving pre-heated air from upstream components of said electronic board or card, and inducing the pre-heated air to rise above downstream components, thereby reducing the possibility of the downstream components overheating from the said pre-heated air due to the fact that they are no longer in a stream of said pre-heated air, and said side portions having air flow surfaces for directing unheated cooling air flow along sides and over tops of said components, wherein a downstream part of the electronic board or card is cooled by fresh, cooler air from side air flow.

2. A cooling system for an electronic board or card, comprising at least one deflector for use with an electronic board or card comprising a number of electronic components, said deflector having a tetrahedral cupped shaped surface which utilizes naturally occurring convection with in a housing containing said electronic board or card, in order to cool said electronic components of said electronic board or card, said deflector having a top portion defining an air lifter and side portions defining air collectors, said top portion having an air flow surface for receiving pre-heated air from upstream components of said electronic board or card and inducing the pre-heated air to rise above downstream components, thereby reducing the possibility of the downstream components overheating from said pre-heated air due to the fact that they are no longer in a stream of said pre-heated air, and said side portions having air flow surfaces for directing unheated cooling air flow along sides and over tops of said components, wherein a downstream part of the electronic board or card is cooled by fresh, cooler air from side air flow.

3. A cooling system for an electronic board or card, comprising at least one deflector for use with an electronic board or card comprising a number of electronic components, said deflector having a ship-like keel shape which utilizes naturally occurring convection within a housing containing said electronic board or card, in order to cool said electronic components of said electronic board or card, said deflector having a top portion defining an air lifter and side portions defining air collectors, said top portion having an air flow surface for receiving pre-heated air from upstream components of said electronic board or card and inducing the pre-heated air to rise above downstream components, thereby reducing the possibility of the downstream components overheating from said pre-heated air due to the fact that they are no longer in a stream of said pre-heated air, and said side portions having air flow surfaces for directing unheated cooling air flow along sides and over tops of said components, wherein a downstream part of the electronic board or card is cooled by fresh, cooler air from side air flow.

\* \* \* \* \*